United States Patent
Fujimori et al.

[11] Patent Number: 6,162,412
[45] Date of Patent: Dec. 19, 2000

[54] CHEMICAL VAPOR DEPOSITION METHOD OF HIGH QUALITY DIAMOND

[75] Inventors: Naoji Fujimori; Akihiko Ikegaya; Takahiro Imai; Nobuhiro Ota, all of Itami; Takayuki Shibata, Otaru, all of Japan

[73] Assignee: Sumitomo Electric Industries, Ltd., Osaka, Japan

[21] Appl. No.: 08/115,783

[22] Filed: Sep. 3, 1993

Related U.S. Application Data

[63] Continuation of application No. 07/821,921, Jan. 16, 1992, abandoned, which is a continuation-in-part of application No. 07/739,518, Aug. 2, 1991, abandoned.

[30] Foreign Application Priority Data

| Aug. 3, 1990 | [JP] | Japan | 2-206976 |
| Aug. 9, 1990 | [JP] | Japan | 2-211015 |
| Aug. 9, 1990 | [JP] | Japan | 2-211016 |
| Aug. 22, 1990 | [JP] | Japan | 2-222262 |

[51] Int. Cl.⁷ .................................................. C23C 16/27
[52] U.S. Cl. ........................................ 423/446; 427/249.8
[58] Field of Search ....................... 423/446; 427/249.13, 427/249.8

[56] References Cited

U.S. PATENT DOCUMENTS

| 3,895,313 | 7/1975 | Seito | 372/103 |
| 4,725,345 | 2/1988 | Sakamoto et al. | 427/38 |
| 4,816,286 | 3/1989 | Hirose | 423/446 |
| 5,015,494 | 5/1991 | Yamazaki | 423/446 |

FOREIGN PATENT DOCUMENTS

| 0288065 | 10/1988 | European Pat. Off. . |
| 0327051 | 8/1989 | European Pat. Off. . |
| 0376694 | 7/1990 | European Pat. Off. . |
| 62-70295 | 3/1987 | Japan . |

OTHER PUBLICATIONS

Zhang et al, "In situ observations of optical emission spectra in the diamond deposition environment of arc discharge plasma chemical vapor deposition", Applied Physics Letters, vo. 57, No. 14, Oct. 1, 1990, pp. 1467–1469.

*Primary Examiner*—Steven P. Griffin
*Assistant Examiner*—Stuart L. Hendrickson
*Attorney, Agent, or Firm*—Pillsbury Madison & Sutro LLP

[57] ABSTRACT

Diamond having a large coefficient of thermal conductivity is prepared by a CVD method in which a reaction gas is decomposed and reacted under such condition that a concentration of carbon atoms in relation to hydrogen gas (A %), a concentration of nitrogen gas in relation to the whole reaction gas (B ppm) and a concentration of oxygen atoms in relation to the hydrogen gas (C %) satisfy the equation:

$$\alpha = B \times (A - 1.2C) \tag{I}$$

provided that a is not larger than 13, or B is not larger than 20.

10 Claims, 2 Drawing Sheets

CHEMICAL VAPOR DEPOSITION METHOD OF HIGH QUALITY DIAMOND

This is a continuation of application Ser. No. 07/821,921, filed on Jan. 16, 1992, which was abandoned upon the filing hereof which is a Continuation-In-Part of abandoned application Ser. No. 07/739,518 filed on Aug. 2, 1991.

BACKGROUND OF THE INVENTION

1. Field of the Invention

The present invention relates to a chemical vapor deposition method of high quality diamond having high thermal conductivity. More particularly, the present invention relates to a method for producing a diamond which is substantially free from non-diamond carbon such as amorphous carbon or graphite by chemical vapor deposition (CVD).

2. Description of the Related Art

Diamond has high hardness, good abrasion resistance, a small compressibility, a small coefficient of thermal expansion and a very large coefficient of thermal conductivity though it is an insulator. In addition, diamond has a large refractive index and optical transparency to UV, visible and IR light as well as chemical resistance. In diamond, sonic wave is transmitted at a high velocity of propagation. Further, addition of a specific impurity can impart semiconductive characteristics to the diamond. Therefore, application of diamond is sought in various technical fields, and now diamond is one of indispensable materials in recent technology.

For example, by making use of the large thermal conductivity, a diamond layer or film is used as a heat sink with high performance for a high output IC or a laser diode.

To synthesize diamond, a super high pressure method and a chemical vapor deposition method are known. The super high pressure method comprises synthesizing diamond from a carbon source in a metal solvent such as iron under super high pressure at high temperature. Since a size of each produced diamond particle is rather small, this method cannot produce a sufficiently large diamond particle for the heat sink which requires a size of several mm to several cm square. Further, since impurity elements from the metal solvent contaminate diamond inevitably, the coefficient of thermal conductivity has a limit. Diamond produced by this method has a coefficient of thermal conductivity of about 22 W/cm.K which is substantially the same as that of IIa type natural diamond, and no diamond having a larger coefficient of thermal conductivity has been produced by this method.

In the CVD method, a raw material gas containing a carbon source and hydrogen is decomposed and activated and diamond is deposited in the form of a film or plate on a substrate. Since the deposition area can be made larger than several cm square, a production cost is low. Various CVD methods have been developed according to difference of means for decomposition and activation of the raw material gas. Among them, a hot filament CVD which uses a heating filament to be heated at high temperature and a plasma CVD which uses microwave plasma or DC thermal plasma are typical.

The diamond film synthesized by any CVD method has a coefficient of thermal conductivity of 16 W/cm.K or less, which is smaller than that of natural diamond or diamond synthesized by the super high pressure catalytic method.

In the CVD method, in general, the raw material gas contains methane as the carbon source and hydrogen, though other carbon compounds such as acetylene, benzene, ethanol and acetone may be used as the carbon source. It is known that the addition of a small amount of a gas containing oxygen (e.g. oxygen, carbon monoxide, carbon dioxide, etc.) to the raw material gas will increase properties of deposited diamond.

Diamond which is synthesized by the CVD method contains a non-diamond carbon such as amorphous carbon or graphite. Hitherto, no clear relationship among the amounts of hydrogen, carbon and oxygen atoms has been established for the production of diamond which is substantially free from the non-diamond carbon. Further, it is very difficult to avoid contamination of nitrogen which is contained in air in a large amount, even though a reaction system is made as close as possible to an ideal system for the synthesis of diamond.

SUMMARY OF THE INVENTION

One object of the present invention is to establish a relationship among hydrogen, carbon, oxygen and optionally nitrogen for the synthesis of high quality diamond by a CVD method.

Another object of the present invention is to provide a method for producing diamond which is free from non-diamond carbon by a CVD method.

A further object of the present invention is to provide a method for producing diamond which contains nitrogen in a very small amount by a CVD method.

A yet another object of the present invention is to provide a method for producing diamond having a large coefficient of thermal conductivity by a CVD method.

According to the present invention, there is provided a method for producing diamond by a CVD method comprising decomposing and reacting a reaction gas with selecting concentrations of source materials such that a concentration of carbon atoms in relation to hydrogen gas (A %), a concentration of nitrogen gas in relation to the whole reaction gas (B ppm) and a concentration of oxygen atoms in relation to the hydrogen gas (C %) satisfy the equation:

$$\alpha = (B)^{1/2} \times (A - 1.2C) \tag{I}$$

provided that $\alpha$ is not larger than 13, or that the concentration of nitrogen gas in relation to the whole reaction gas (B ppm) is not larger than 20.

DETAILED DESCRIPTION OF THE DRAWINGS

Figure 1:
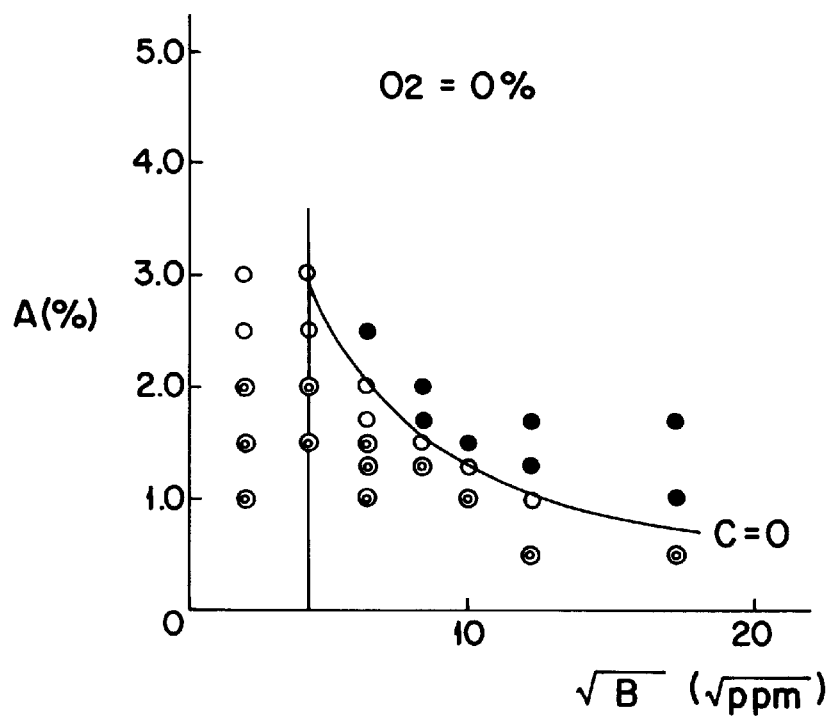
FIGS. 1, 2 and 3 are graphs plotting the quality of the diamond films synthesized in Examples 1 and 2.

In the present invention, the diamond film is deposited on a substrate in the same manner as in the conventional CVD method except that the concentration of the raw materials are selected to satisfy the above equation (I).

In one embodiment of the present invention, the carbon atoms contained in the reaction gas comprises 99.9% or more of $^{12}C$ or $^{13}C$ and synthesized diamond contains 20 ppm or less, preferably 5 ppm or less of nitrogen atoms. Thereby, the diamond film has a large coefficient of thermal conductivity of at least 25 W/cm.K. In view of the phonon energy, $^{12}C$ is preferred.

Carbon comprising 99.9% or more of $^{12}C$ or $^{13}C$ may be obtained by mass separation of a conventional carbon source such as methane, ethane, acetylene, an alcohol, a ketone, carbon monoxide, carbon dioxide, etc.

The decrease of the nitrogen atom content in synthesized diamond can be achieved by decrease of the nitrogen atom in the reaction gas.

Herein, the term "substantially free from the non-diamond carbon" intends to mean that, in the Raman spectroscopic spectrum, a ratio of a peak height of non-diamond carbon to that of diamond is not larger than 0.07, preferably not larger than 0.05.

When a filament made of carbon, in particular carbon comprising 99.9% or more of $^{12}C$ or $^{13}C$ is used as a filament to be used in the hot filament CVD method, contamination of synthesized diamond with metal impurities generated from a metal filament such as W, Ta, Re, etc. can be prevented. As the carbon filament, one made of amorphous carbon, graphite or carbon composite may be used.

When the diamond produced by the present invention is used as a heat sink, the substrate may be removed. When the diamond is deposited on a substrate made of a highly thermal conductive metal or ceramic such as copper-tungsten alloy (for example, CMSH manufactured by Sumitomo Electric Industries, Ltd.), aluminum nitride and boron nitride, or a diamond single crystal such as a synthetic Ib type diamond single crystal, the substrate may not be removed. When such substrate is used, the heat sink has a larger heat conductivity than the conventional one even if the thickness of the diamond layer or the substrate is made thin. Further, a heat radiation efficiency of the heat sink can be greatly increased.

The present invention will be illustrated by the following examples.

EXAMPLE 1

Diamond was synthesized by the conventional microwave plasma CVD using, as a reaction gas, a mixture of hydrogen gas (purity of 7N) and methane gas (purity of 6N) or a mixture of hydrogen gas (purity of 7N), methane gas (purity of 6N) and nitrogen gas. When the nitrogen gas was not positively added, it was contained in a very small amount in the reaction gas to be introduced in a reaction chamber. The concentration of such inadvertently contained nitrogen gas was less than 4 ppm when precisely measured by gas chromatography.

With varying the concentration of the methane gas in relation to the hydrogen gas and the concentration of the nitrogen gas in relation to the whole reaction gas, diamond was synthesized. The conditions are shown in Table 1. In Table 1, the α value is indicated when B was larger than 20. For comparison, the a is indicated in the brackets when B was 20.

When the nitrogen gas was not positively added, its concentration is indicated as "<4 ppm" in Table 1.

The diamond film quality was evaluated by Raman spectroscopy which is effective to detect the non-diamond carbon as follows:

In the Raman spectroscopy, a ratio of the maximum height of a broad peak of the non-diamond carbon which appears from 1350 to 1600 cm$^{-1}$ to the peak height of diamond around 1333 cm$^{-1}$ is calculated and ranked according to the following criteria:

: Less than 0.1.

: From 0.1 to 0.3.

: Larger than 0.3.

As understood from the results in Table 1, when the methane gas concentration was constant, the quality of the diamond film was quickly deteriorated as the nitrogen gas concentration was increased, and the diamond film was black which was seen by naked eyes (Quality ranking ).

When the nitrogen gas concentration in the reaction gas was high, the deterioration of the diamond quality was prevented by the decrease of the methane gas concentration.

As to the influence of the nitrogen gas concentration, when it was less than 20 ppm, the diamond film quality was not drastically deteriorated if the a value exceeded 13 as seen in Sample No. 29.

That is, when the nitrogen gas concentration in the reaction gas is 20 ppm or less, it does not have no influence to the diamond film quality.

TABLE 1

| Sample No. | CH$_4$(%) | O$_2$(%) | N$_2$(B ppm) | α | Quality of diamond film |
|---|---|---|---|---|---|
| 1 | 0.5 | 0 | 150 | 6.1 | ⊚ |
| 2 | ↑ | ↑ | 300 | 8.7 | ⊚ |
| 3 | ↑ | ↑ | <4 | — | ⊚ |
| 4 | ↑ | ↑ | 40 | 6.3 | ⊚ |
| 5 | ↑ | ↑ | 100 | 10.0 | ⊚ |
| 6 | ↑ | ↑ | 150 | 12.2 | ○ |
| 7 | ↑ | ↑ | 300 | 17.3 | ● |
| 8 | 1.3 | ↑ | 40 | 8.2 | ⊚ |
| 9 | ↑ | ↑ | 70 | 10.9 | ⊚ |
| 10 | ↑ | ↑ | 100 | 13.0 | ○ |
| 11 | ↑ | ↑ | 150 | 15.9 | ● |
| 12 | 1.5 | ↑ | <4 | — | ⊚ |
| 13 | ↑ | ↑ | 20 | (6.7) | ⊚ |
| 14 | ↑ | ↑ | 40 | 9.5 | ⊚ |
| 15 | ↑ | ↑ | 70 | 12.5 | ○ |
| 16 | ↑ | ↑ | 100 | 15.0 | ● |
| 17 | 1.7 | ↑ | 40 | 10.8 | ⊚ |
| 18 | ↑ | ↑ | 70 | 14.2 | ● |
| 19 | ↑ | ↑ | 150 | 20.8 | ● |
| 20 | ↑ | ↑ | 300 | 29.4 | ● |
| 21 | 2.0 | ↑ | <4 | — | ⊚ |
| 22 | ↑ | ↑ | 20 | (8.9) | ⊚ |
| 23 | ↑ | ↑ | 40 | 12.6 | ○ |
| 24 | ↑ | ↑ | 70 | 16.7 | ● |
| 25 | 2.5 | ↑ | <4 | — | ○ |
| 26 | ↑ | ↑ | 20 | (11.2) | ○ |
| 27 | ↑ | ↑ | 40 | 15.8 | ● |
| 28 | 3.0 | ↑ | <4 | — | ○ |
| 29 | ↑ | ↑ | 20 | (13.4) | ○ |

EXAMPLE 2

In the same manner as in Example 1 but changing the composition of the reaction gas as shown in Tables 2 and 3, the diamond was synthesized and its quality was evaluated. The results are shown in Tables 2 and 3, which relate to the cases where 0.5% and 2.0% of the oxygen gas was used in relation to the hydrogen gas, respectively.

These results show that the increase of the nitrogen gas concentration in the reaction gas has influence on the diamond film quality.

When the oxygen gas was added, the carbon gas concentration at which the film quality starts to decrease was lower than in the case where no oxygen gas was added, and such carbon gas concentration increases as the oxygen gas concentration increases.

In case where the oxygen gas was added, when the nitrogen gas concentration was less than 20 ppm, there was no difference in the Raman spectroscopy and SEM observation.

TABLE 2

| Sample No. | CH$_4$(%) | Concentration O$_2$(%) | N$_2$(B ppm) | α | Quality of diamond film |
|---|---|---|---|---|---|
| 30 | 1.7 | 0.5 | 150 | 6.1 | ⊙ |
| 31 | ↑ | ↑ | 300 | 8.7 | ⊙ |
| 32 | 2.0 | ↑ | <4 | — | ⊙ |
| 33 | ↑ | ↑ | 20 | (3.6) | ⊙ |
| 34 | ↑ | ↑ | 70 | 6.7 | ⊙ |
| 35 | ↑ | ↑ | 150 | 9.8 | ⊙ |
| 36 | 2.2 | ↑ | <4 | — | ⊙ |
| 37 | ↑ | ↑ | 150 | 12.2 | ○ |
| 38 | ↑ | ↑ | 300 | 17.3 | ● |
| 39 | 2.5 | ↑ | 40 | 6.3 | ⊙ |
| 40 | ↑ | ↑ | 100 | 13.0 | ○ |
| 41 | ↑ | ↑ | 150 | 15.9 | ● |
| 42 | 3.0 | ↑ | <4 | — | ⊙ |
| 43 | ↑ | ↑ | 20 | (8.0) | ⊙ |
| 44 | ↑ | ↑ | 40 | 11.4 | ○ |
| 45 | ↑ | ↑ | 70 | 15.1 | ● |
| 46 | ↑ | ↑ | 150 | 22.0 | ● |
| 47 | ↑ | ↑ | 300 | 31.2 | ● |
| 48 | 4.0 | ↑ | <4 | — | ○ |
| 49 | ↑ | ↑ | 40 | 17.7 | ● |
| 50 | ↑ | ↑ | 150 | 34.3 | ● |
| 51 | ↑ | ↑ | 300 | 48.5 | ● |
| 52 | 4.5 | ↑ | <4 | — | ○ |
| 53 | ↑ | ↑ | 20 | (14.8) | ○ |

TABLE 3

| Sample No. | CH$_4$(%) | Concentration O$_2$(%) | N$_2$(B ppm) | α | Quality of diamond film |
|---|---|---|---|---|---|
| 54 | 5.5 | 2.0 | <4 | — | ⊙ |
| 55 | ↑ | ↑ | 100 | 7.0 | ⊙ |
| 56 | ↑ | ↑ | 150 | 8.6 | ⊙ |
| 57 | ↑ | ↑ | 300 | 12.1 | ○ |
| 58 | 6.0 | ↑ | <4 | — | ⊙ |
| 59 | ↑ | ↑ | 20 | (5.4) | ⊙ |
| 60 | ↑ | ↑ | 100 | 12.0 | ○ |
| 61 | ↑ | ↑ | 150 | 14.7 | ● |
| 62 | ↑ | ↑ | 300 | 20.8 | ● |
| 63 | 6.5 | ↑ | <4 | — | ⊙ |
| 64 | ↑ | ↑ | 20 | (7.6) | ⊙ |
| 65 | ↑ | ↑ | 40 | 10.8 | ⊙ |
| 66 | ↑ | ↑ | 70 | 14.2 | ● |
| 67 | ↑ | ↑ | 100 | 17.0 | ● |
| 68 | 7.5 | ↑ | <4 | — | ⊙ |
| 69 | ↑ | ↑ | 20 | (12.1) | ⊙ |
| 70 | ↑ | ↑ | 40 | 17.0 | ● |
| 71 | 8.0 | ↑ | <4 | — | ⊙ |
| 72 | ↑ | ↑ | 20 | (14.3) | ⊙ |

Figure 2:
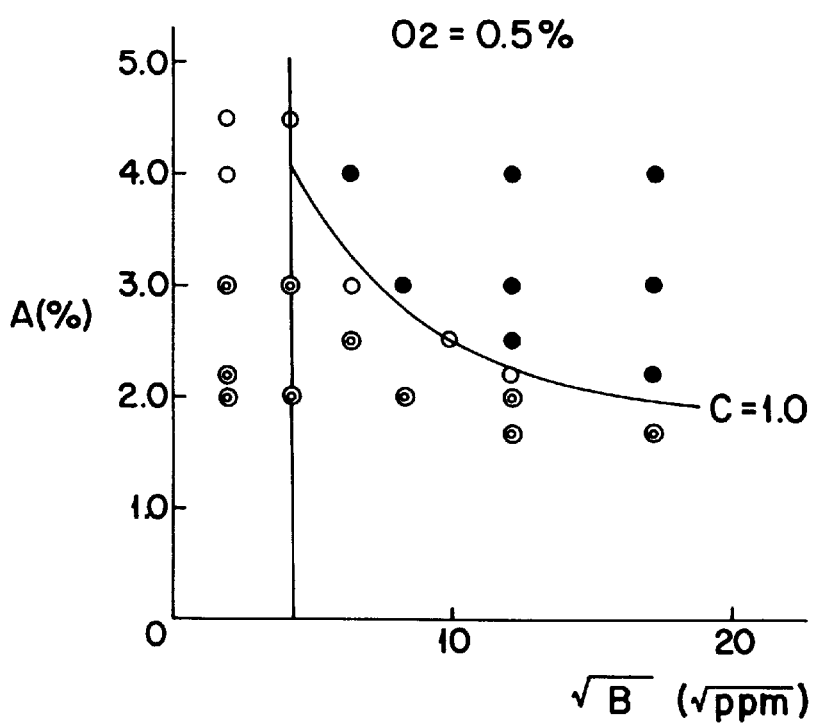
Figure 3:
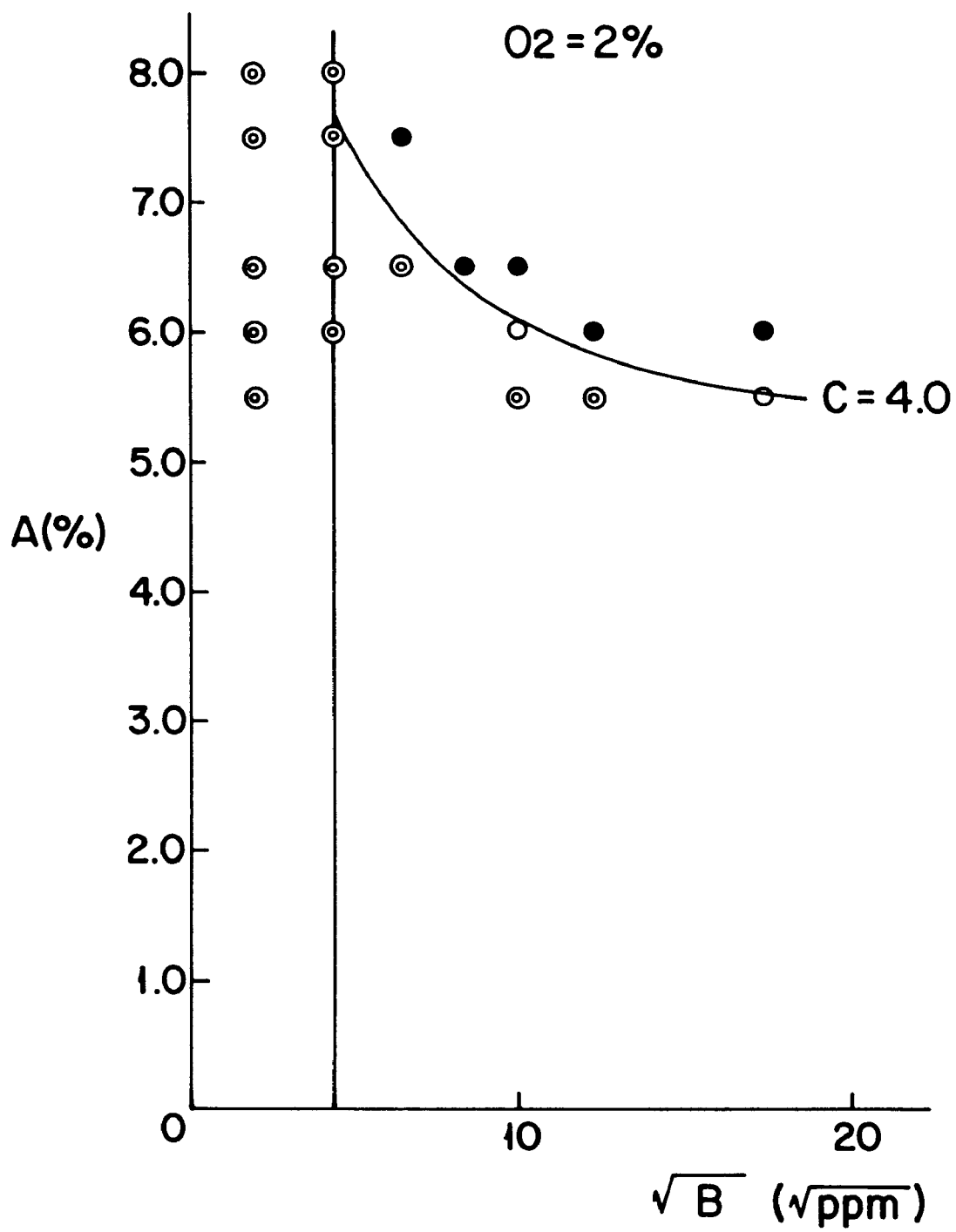

The film quality in Tables 1, 2 and 3 are plotted in FIGS. 1, 2 and 3 with B being on the abscissa and A being on the ordinate. In figures, the solid curve and the solid line correspond to α=√B×(A−1.2C)=13 and B=20, respectively.

From these figures, it is understood that when the concentrations of the components in the reaction gas satisfy the above equation (I), the diamond film has good quality.

EXAMPLE 3

In the same manner as in Example 1 but using methane, acetylene, benzene, ethanol or acetone as a carbon source, oxygen, carbon monoxide or carbon dioxide as an oxygen source and nitrogen in concentrations shown in Table 4, a diamond film was deposited.

When the concentrations of the raw materials satisfy the above equation (I), the diamond film had good quality.

TABLE 4

| Sample No. | Carbon source (%) | Oxygen Source (%) | N$_2$ (B ppm) | α | Quality of diamond film |
|---|---|---|---|---|---|
| 73 | CH$_4$ (2.0) | CO (1.0) | 40 | 11.4 | ○ |
| 74 | ↑ | ↑ | 100 | 18.0 | ● |
| 75 | C$_2$H$_2$ (3.5) | O$_2$ (2.0) | <4 | — | ⊙ |
| 76 | ↑ | ↑ | 20 | (9.8) | ⊙ |
| 77 | ↑ | ↑ | 50 | 15.6 | ● |
| 78 | ↑ (4.0) | ↑ | 20 | (14.3) | ⊙ |
| 79 | C$_6$H$_6$ (0.5) | CO$_2$ (1.0) | 10 | — | ⊙ |
| 80 | ↑ | ↑ | 100 | 16.0 | ● |
| 81 | ↑ (0.8) | ↑ | <4 | — | ○ |
| 82 | ↑ | ↑ | 20 | (15.2) | ○ |
| 83 | C$_2$H$_5$OH (2.0) | — | <4 | — | ⊙ |
| 84 | ↑ | — | 50 | 11.3 | ○ |
| 85 | ↑ | — | 70 | 13.4 | ● |
| 86 | (CH$_3$)CO (1.0) | CO (0.5) | 30 | 9.3 | ⊙ |
| 87 | ↑ | ↑ | 50 | 12.0 | ○ |
| 88 | ↑ | ↑ | 70 | 14.2 | ● |

EXAMPLE 4

A diamond film was synthesized by the conventional microwave plasma CVD using a methane gas containing 99.95% of $^{12}$C. Purities of methane and hydrogen were 99.9999% and 99.99999%, respectively.

An amount of the nitrogen gas contained in the reaction gas was precisely measured by gas chromatography to find that it was 8 ppm. At a ratio of methane and hydrogen of 1:100, the diamond film having a thickness of about 500 μm was deposited in 500 hours on a silicon wafer a surface of which was abrased with diamond powder.

After removing the substrate with an acid, the diamond film was abrased to a thickness of 300 μm.

The coefficient of thermal conductivity of this film was 30 W/cm.K.

EXAMPLE 5

In the same manner as in Example 4 but changing the content of $^{12}$C in the methane gas, a diamond film was synthesized. The coefficient of thermal conductivity was as follows:

| Content of $^{12}$C (%) | Coefficient of thermal conductivity |
|---|---|
| 99 | 16 |
| 99.5 | 16 |
| 99.8 | 18 |
| 99.9 | 25 |
| 99.92 | 29 |
| 99.95 | 30 |
| 99.99 | 33.5 |

EXAMPLE 6

In the same manner as in Example 4 but changing the nitrogen concentration, a diamond film was synthesized. The coefficient of thermal conductivity was as follows:

| Nitrogen content (ppm) | Coefficient of thermal conductivity |
| --- | --- |
| 1 | 34 |
| 5 | 33 |
| 8 | 30 |
| 10 | 30 |
| 12 | 30 |
| 15 | 28 |
| 20 | 25 |
| 25 | 18 |
| 30 | 11 |
| 40 | 8 |

EXAMPLE 7

A diamond film was synthesized by the conventional hot filament CVD using a methane gas containing 99.92% of $^{12}C$. As the filament, a tungsten wire of 0.2 mm in diameter was used and heated at 2080° C. The substrate temperature was kept at 950° C.

The nitrogen content in the reaction gas was 10 ppm. At the methane concentration of 1.2%, diamond was deposited for 600 hours to obtain a diamond film having a thickness of 450 μm.

After removing the substrate with an acid, the diamond film was abrased to a thickness of 300 μm.

The coefficient of thermal conductivity of this film was 25 W/cm.K.

EXAMPLE 8

A diamond film was deposited by the conventional microwave plasma CVD using a methane gas containing 99.95% of $^{12}C$ and hydrogen on a silicon wafer (20 mm square) which had been abrased with #5000 diamond abrasive.

The nitrogen content in the reaction gas was 20 ppm by the gas chromatography analysis.

The diamond was deposited on the wafer using a reaction gas containing methane and hydrogen in a ratio of 1:100 under an reactor pressure of 400 Torr, at a microwave output of 400 W, at a substrate temperature of 950° C. for 500 hours to obtain a diamond film having a thickness of about 500 μm.

After removing the substrate wafer with hydrofluoric acid to recover the diamond thin film, and both surfaces of the diamond film were abrased to a thickness of 300 μm.

The composition of the diamond film was analyzed by a coupled apparatus of thermal decomposition gas chromatography and mass spectroscopy to find that the content of $^{12}C$ was 99.95% and the content of nitrogen was 5 ppm.

According to the Raman spectroscopy, a peak height ratio of the non-diamond carbon to diamond was 0.03.

The coefficient of thermal conductivity of the diamond film was measured by comparing a temperature gradient at a constant heat flux with a known diamond sample. It was 30 W/cm.K.

EXAMPLE 9

In the same manner as in Example 8 but changing the ratio of methane to hydrogen and the substrate temperature, a diamond film was synthesized.

The quality of the diamond film was evaluated in the same manner as in Example 8. The contents of $^{12}C$ and nitrogen were the same as the diamond film obtained in Example 8, and the peak height ratio of the non-diamond carbon to diamond and the coefficient of thermal conductivity were as shown in Table 5.

TABLE 5

| Sample No. | Peak height ratio of non-diamond carbon to diamond | Coefficient of thermal conductivity (W/cm · K) |
| --- | --- | --- |
| 101 | 0.01 | 33 |
| 102 | 0.03 | 30 |
| 103 | 0.07 | 25 |
| 104 | 0.10 | 16 |
| 105 | 0.15 | 9 |

EXAMPLE 10

In the same manner as in Example 8 but changing the content of $^{12}C$ in methane, a diamond film was synthesized.

The quality of the diamond film was evaluated in same manner as in Example 1. The peak height ratio of non-diamond carbon to diamond was the same as in Example 1. The content of $^{12}C$ in the diamond film was the same as in methane. The relationship between the content of $^{12}C$ to the coefficient of thermal conductivity is shown in Table 6.

TABLE 6

| Sample No. | Content of $^{12}C$ in diamond (%) | Coefficient of thermal conductivity (W/cm · K) |
| --- | --- | --- |
| 106 | 99.00 | 16 |
| 107 | 99.50 | 16 |
| 108 | 99.80 | 18 |
| 109 | 99.90 | 25 |
| 110 | 99.92 | 29 |
| 111 | 99.95 | 30 |
| 112 | 99.99 | 33 |

EXAMPLE 11

In the same manner as in Example 8 but changing the content of $^2C$ in methane to 99.9% and the content of nitrogen in the reaction gas as shown in Table 7, the diamond film was synthesized.

The quality of the diamond film was evaluated in the same manner as in Example 8. The content of 12C in the diamond film was 99.9%, and the peak height ratio of the non-diamond carbon to diamond was the same as in Example 8. The relationship between the nitrogen contents in the reaction gas and the diamond film and the coefficient of thermal conductivity is shown in Table 7.

TABLE 7

| Sample No. | N content in reaction gas (ppm) | N content in diamond film (ppm) | Coefficient of thermal conductivity (W/cm · K) |
| --- | --- | --- | --- |
| 113 | 1 | 0.2 | 34 |
| 114 | 5 | 1 | 33 |
| 115 | 8 | 2 | 30 |
| 116 | 10 | 3 | 30 |
| 117 | 12 | 3 | 30 |
| 118 | 15 | 4 | 28 |
| 119 | 20 | 5 | 25 |
| 120 | 25 | 7 | 18 |
| 121 | 30 | 8 | 11 |
| 122 | 40 | 10 | 8 |

EXAMPLE 12

A diamond film was deposited by the conventional hot filament CVD (W filament having a diameter of 0.2 mm)

using a methane gas containing 99.92% of $^{12}$C and hydrogen on a silicon wafer (4 inch square) which had been abrased in the same manner as in Example 8.

The nitrogen content in the reaction gas was 50 ppm by the gas chromatography analysis.

The diamond was deposited on the wafer using a reaction gas containing methane and hydrogen in a ratio of 1.2:100 under an reactor pressure of 40 Torr, at a filament temperature of 2080° C., at a substrate temperature of 950° C. for 600 hours to obtain a diamond film having a thickness of about 450 μm.

After removing the substrate wafer with hydrofluoric acid to recover the diamond thin film, and both surfaces of the diamond film were abrased to a thickness of 300 μm.

The composition of the diamond film was analyzed by a coupled apparatus of thermal decomposition gas chromatograph and mass spectroscopy to find that the content of $^{12}$C was 99.92% and the content of nitrogen was 3 ppm.

According to the Raman spectroscopy, a peak height ratio of the non-diamond carbon to diamond was 0.03.

The coefficient of thermal conductivity of the diamond film was 25 W/cm.K.

EXAMPLE 13

A diamond film was deposited by the conventional hot filament plasma CVD using a graphite filament containing 99.9% of $^{12}$C on a silicon wafer (10 mm square, and 3 mm thick) which had been abrased with #5000 diamond abrasive.

After evacuating a reactor chamber to 1×10$^{-6}$ Torr, methane containing 99.5 % of $^{12}$C and hydrogen were supplied in the reactor at flow rates of 10 sccm and 500 sccm, respectively. The nitrogen content in the reaction gas was less than 1 ppm by the gas chromatography analysis.

The diamond was deposited on the wafer for 150 hours by heating the filament which was placed at a distance of 8 mm from the wafer surface at 2100° C., adjusting the wafer temperature at 950, keeping the interior pressure at 150 Torr to obtain a diamond film having a thickness of about 0.5 mm.

After removing the substrate wafer with hydrofluoric acid to recover the diamond thin film, and both surfaces of the diamond film were abrased to a thickness of 0.3 mm with a surface roughness R$_{max}$ of 0.03 μm.

Non-diamond carbon was not found in the diamond film by the Raman spectroscopy.

The coefficient of thermal conductivity of the diamond film was measured by comparing a temperature gradient at a constant heat flux with a known diamond sample. It was 34 W/cm.K.

EXAMPLE 14

In the same manner as in Example 13 but changing the contents of $^{12}$C in the graphite filament, $^{12}$C in methane and nitrogen in the reaction gas as shown in Table 8, a diamond film was synthesized.

After polishing the diamond film to a thickness of 0.3 mm and R$_{max}$ of 0.04 μm, the coefficient of thermal conductivity was measured. The results are shown in Table 8.

TABLE 8

| Sample No. | $^{12}$C content in graphite (%) | $^{12}$C content in methane (%) | N content reaction gas (ppm) | Coefficient of thermal conductivity (W/cm · K) |
|---|---|---|---|---|
| 123 | 99.0 | 99.9 | 1 | 18 |
| 124 | 99.5 | 99.9 | 1 | 21 |
| 125 | 99.9 | 99.9 | 1 | 26 |
| 126 | 99.95 | 99.9 | 1 | 28 |
| 127 | 99.99 | 99.9 | 1 | 30 |
| 128 | 99.9 | 99.0 | 1 | 16 |
| 129 | 99.9 | 99.5 | 1 | 18 |
| 130 | 99.9 | 99.9 | 1 | 26 |
| 131 | 99.9 | 99.95 | 1 | 32 |
| 132 | 99.9 | 99.99 | 1 | 35 |
| 133 | 99.9 | 99.95 | 5 | 30 |
| 134 | 99.9 | 99.95 | 10 | 28 |
| 135 | 99.9 | 99.95 | 15 | 27 |
| 136 | 99.9 | 99.95 | 20 | 25 |
| 137 | 99.9 | 99.95 | 25 | 17 |

EXAMPLE 15

A diamond film was formed by the conventional microwave plasma CVD using, as a raw material gas, a mixture of a methane gas in which 99.95% of carbon was $^{12}$C and a hydrogen gas in a volume ratio of 1:100. A content of nitrogen in the raw material gas was analyzed by gas chromatography and found to be 20 ppm. Using a piece of a synthetic Ib type single crystal in the (100) plane direction having a width of 3 mm, a length of 3 mm and a thickness of 1 mm, the diamond was deposited for 100 hours to produce a homoepitaxial diamond film having a thickness of about 200 μm. A deviation of the plane direction of the diamond single crystal substrate was within 5 degrees. The surface was polished.

The RHEED analysis confirmed that the diamond film was homoepitaxially grown and in a single crystal form. A composition of the diamond film was analyzed by a pyrolysis gas chromatography-mass spectroscopy interlocking type analyzer. The diamond film contained 5 ppm of nitrogen and the content of $^{12}$C was 99.95%. In the Raman spectroscopy, an intensity ratio of non-diamond to diamond was 0.03. A coefficient of thermal conductivity of the diamond film was 35 W/cm.K, which was much larger than that of the synthetic Ib type diamond (20 W/cm.K).

EXAMPLE 16

As a substrate, a copper-tungsten alloy was used. Its surface was planished and then subjected to the ultrasonic washing for 20 minutes in methanol in which No. 1000 diamond abrasive grains were suspended with facing the planished surface downwards.

With varying a concentration of methane and a substrate temperature as shown in Table 9, a diamond film was grown on the substrate for 10 hours by the conventional microwave plasma CVD method. Other conditions were as follows:

A content of $^{12}$C in the methane gas was 99.95% and a nitrogen content in the raw material gas was 20 ppm.

The formed diamond film had a thickness of about 20 μm and contained 5 ppm of nitrogen. The $^{12}$C content in the diamond film was 99.95%.

The intensity ratio of non-diamond/diamond measured by the Raman spectroscopy and the coefficient of thermal conductivity are shown in Table 9.

TABLE 9

| CH$_4$/H$_2$ ratio | Substrate temperature (° C.) | Intensity ratio of non-diamond/diamond | Coefficient of thermal conductivity (W/cm · K) |
| --- | --- | --- | --- |
| 0.01 | 900 | 0.01 | 20 |
| 0.01 | 800 | 0.03 | 17 |
| 0.02 | 900 | 0.07 | 14 |
| 0.02 | 1000 | 0.10 | 8 |
| 0.03 | 900 | 0.15 | 6 |

EXAMPLE 17

Using a methane gas containing $^{12}$C in a content shown in Table 10, a diamond film was grown in the same manner as in Example 16. The $^{12}$C content in the diamond film and the coefficient of thermal conductivity are shown in Table 10.

TABLE 10

| $^{12}$C content in methane (%) | $^{12}$C content in grown diamond (%) | N content in grown diamond (ppm) | Coefficient of thermal conductivity (W/cm · K) |
| --- | --- | --- | --- |
| 99 | 99 | 5 | 6 |
| 99.5 | 99.5 | 5 | 6 |
| 99.8 | 99.8 | 5 | 8 |
| 99.9 | 99.9 | 5 | 11 |
| 99.92 | 99.92 | 5 | 13 |
| 99.95 | 99.95 | 5 | 17 |
| 99.99 | 99.99 | 5 | 20 |

EXAMPLE 18

Using a methane gas containing 99.9% of $^{12}$C and a raw material gas containing nitrogen in an amount of Table 11, a diamond film was drown in the same manner as in Example 17. The nitrogen content and the coefficient of thermal conductivity of the grown diamond are shown in Table 11.

TABLE 11

| N content in raw material (ppm) | N content in grown diamond (ppm) | Coefficient of thermal conductivity (W/cm · K) |
| --- | --- | --- |
| 1 | 0.2 | 20 |
| 5 | 1 | 20 |
| 8 | 2 | 17 |
| 10 | 3 | 17 |
| 12 | 3 | 16 |
| 15 | 4 | 14 |
| 20 | 5 | 12 |
| 25 | 7 | 7 |
| 30 | 8 | 4 |
| 40 | 10 | 3 |

EXAMPLE 19

Using, as a substrate, an aluminum nitride sintered material a surface of which was treated in the same manner as in Example 16 and varying a methane concentration and a substrate temperature, a diamond film was grown as follows:

Using a mixture a methane gas containing 99.95% of $^{12}$C and a hydrogen gas, a diamond film having a thickness of about 10 μm was formed by the conventional microwave plasma CVD in 7 hours. A content of nitrogen in the raw material gas mixture was measured by gas chromatography and found to be 20 ppm. A composition of the diamond film was analyzed by a pyrolysis gas chromatography-mass spectroscopy interlocking type analyzer. The nitrogen content was 5 ppm and the $^{12}$C content was 99.95%. By the Raman spectroscopy, an intensity ratio of non-diamond to diamond was measured. The results are shown in Table 12.

TABLE 12

| CH$_4$/H$_2$ ratio | Substrate temperature (° C.) | Intensity ratio of non-diamond/diamond | Coefficient of thermal conductivity (W/cm · K) |
| --- | --- | --- | --- |
| 0.01 | 900 | 0.01 | 19 |
| 0.01 | 800 | 0.03 | 17 |
| 0.02 | 900 | 0.07 | 15 |
| 0.02 | 1000 | 0.10 | 8 |
| 0.03 | 900 | 0.15 | 5 |

EXAMPLE 20

By a conventional filament CVD method using a tungsten filament having a diameter of 0.2 mm and being kept at 2080° C. and, as a substrate, a sintered material of cubic system boron nitride, a diamond film was grown from a mixture of 1.2% of a methane gas containing 99.92% of 13C and 98.8% of a hydrogen gas at a substrate temperature of 950° C. A content of nitrogen in the raw material was 50 ppm. After 600 hours growing, a diamond film having a thickness of 450 μm was formed. The nitrogen content and the $^{13}$C content in the diamond film were 3 ppm and 99.92%, respectively. As the result of the Raman spectroscopy, an intensity ratio of non-diamond to diamond was 0.03. The diamond film on the substrate had a coefficient of thermal conductivity of 28 W/cm.K.

What is claimed is:

1. A method for producing diamond by a CVD method comprising:

decomposing and reacting a reaction gas containing carbon atoms, hydrogen atoms, oxygen atoms, and nitrogen gas, a concentration of carbon atoms in relation to hydrogen atoms being (A %), a concentration of nitrogen gas in relation to the whole reaction gas being (B ppm), and a concentration of oxygen atoms in relation to hydrogen atoms being (C %), the amounts of A, B and C satisfying the equation:

$$\alpha = (B)^{1/2} \times (A - 1.2C)$$

wherein a is not larger than 13 or B is not larger than 20 and said carbon atoms comprise at least 99.9% of $^{12}$C or $^{13}$C, and further wherein synthesized diamond contains 20 ppm or less of nitrogen atoms.

2. The method according to claim 1, wherein said carbon atoms in said reaction gas comprises 99.9% or more of $^{12}$ C.

3. The method according to claim 1, wherein synthesized diamond contains 5 ppm or less of nitrogen atoms.

4. The method according to claim 1, wherein synthesized diamond has a coefficient of thermal conductivity of at least 25 W/cm.K at 300 K.

5. The method according to claim 1, wherein at least one compound selected from the group consisting of methane, ethane, acetylene, an alcohol, a ketone, carbon monoxide and carbon dioxide is used as a carbon source.

6. The method according to claim 1, wherein the CVD method is carried out using a filament for heating source materials, and said filament is a carbon filament containing at least 99.9% of $^{12}$C or $^{13}$C.

7. The method according to claim 1, wherein the diamond is formed on a substrate made of a material selected from the group consisting of copper-tungsten alloy, gold, silver, copper aluminum, a ceramic and a synthetic Ib type diamond single crystal.

8. The method according to claim 1, wherein the diamond is formed on a substrate comprising a material selected from the group consisting of metals having a thermal conductivity of at least the thermal conductivity of copper-tungsten alloy.

9. A synthetic diamond which is formed by a CVD method on a substrate made of a material selected from the group consisting of copper-tungsten alloy, gold, silver, copper aluminum, a ceramic and a synthetic Ib type diamond single crystal, wherein at least 99.9% of carbon in the synthetic diamond comprises at least one carbon isotope selected from the group consisting of $^{12}$C and $^{13}$C, a nitrogen content in the synthetic diamond is less than 20 ppm, and a ratio of a peak height of non-diamond carbon to that of diamond in the Raman spectrosphic spectrum of the synthetic diamond is not larger than 0.07.

10. A synthetic diamond which is formed by a CVD method on a substrate made of a material selected from the group consisting of metals having a thermal conductivity of at least the thermal conductivity of copper-tungsten alloy, a ceramic and a synthetic Ib type diamond single crystal, wherein at least 99.9% of carbon in the synthetic diamond comprises at least one carbon isotope selected from the group consisting of 12C and 13C, a nitrogen content in the synthetic diamond is less than 20 ppm, and a ratio of a peak height of non-diamond carbon to that of diamond in the Raman spectroscopic spectrum of the synthetic diamond is not larger than 0.07.

* * * * *